US010135178B2

(12) United States Patent
Li et al.

(10) Patent No.: US 10,135,178 B2
(45) Date of Patent: Nov. 20, 2018

(54) ELECTRICAL DEVICE ASSEMBLY AND ELECTRICAL CONNECTOR THEREWITH

(71) Applicant: FOXCONN INTERCONNECT TECHNOLOGY LIMITED, Grand Cayman (KY)

(72) Inventors: Dong Li, Kunshan (CN); Zhi-Hui Zhu, Kunshan (CN); Xiao Wang, Kunshan (CN); Shu-Jian Wang, Kunshan (CN); Yen-Chih Chang, New Taipei (TW)

(73) Assignee: FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 15/650,829

(22) Filed: Jul. 14, 2017

(65) Prior Publication Data

US 2018/0019538 A1 Jan. 18, 2018

(30) Foreign Application Priority Data

Jul. 14, 2016 (CN) .......................... 2016 1 0553432

(51) Int. Cl.

| | |
|---|---|
| ***H01R 13/625*** | (2006.01) |
| ***H01R 13/62*** | (2006.01) |
| ***H01R 12/89*** | (2011.01) |
| ***H01R 13/28*** | (2006.01) |
| ***H01R 13/514*** | (2006.01) |
| ***H01R 33/76*** | (2006.01) |
| ***H01R 12/78*** | (2011.01) |
| ***H01R 13/26*** | (2006.01) |
| ***H01R 13/631*** | (2006.01) |
| ***H01R 24/62*** | (2011.01) |

(Continued)

(52) U.S. Cl.

CPC ............ *H01R 13/62* (2013.01); *H01R 12/78* (2013.01); *H01R 12/89* (2013.01); *H01R 13/26* (2013.01); *H01R 13/28* (2013.01); *H01R 13/514* (2013.01); *H01R 13/631* (2013.01); *H01R 24/62* (2013.01); *H01R 33/76* (2013.01); *H01R 13/22* (2013.01); *H01R 13/436* (2013.01); *H05K 999/99* (2013.01)

(58) Field of Classification Search

CPC ...... H01R 13/62; H01R 13/28; H01R 13/514; H01R 13/436; H01R 13/40; H01R 12/89; H01R 33/76

USPC ........................................ 439/929, 374, 347

See application file for complete search history.

(56) References Cited

U.S. PATENT DOCUMENTS 3,264,599 A * 8/1966 Kinkaid ............... H01R 12/724 439/374

4,941,841 A * 7/1990 Darden .................. G06F 1/184 361/679.39

(Continued)

*Primary Examiner* — Abdullah Riyami

*Assistant Examiner* — Vladimir Imas

(74) *Attorney, Agent, or Firm* — Wei Te Chung; Ming Chieh Chang

(57) ABSTRACT

An electrical device assembly includes a first connector assembly coupled with a second connector assembly via a sliding arrangement. The first connector assembly includes a first terminal module and a first coupling device. The first terminal module includes a first mating face and the first contacts exposed thereon. The first coupling device includes the sliding rail forming a sliding slot with an insertion opening including a sliding opening so as to expose the sliding slot to an exterior.

16 Claims, 20 Drawing Sheets

(51) Int. Cl.
*H01R 13/436* (2006.01)
*H01R 13/22* (2006.01)

(56) References Cited

U.S. PATENT DOCUMENTS

| | | | | |
|---|---|---|---|---|
| 5,122,077 | A * | 6/1992 | Maejima | H01R 13/514 439/398 |
| 5,288,251 | A * | 2/1994 | Sumida | H01R 13/514 439/701 |
| 5,425,653 | A * | 6/1995 | Koiso | H01R 13/6272 439/347 |
| 5,431,570 | A * | 7/1995 | Gibbs | B60Q 1/302 224/315 |
| 5,435,742 | A * | 7/1995 | Cecil, Jr. | H01R 13/639 439/347 |
| 5,808,867 | A * | 9/1998 | Wang | G06F 1/18 361/679.49 |
| 5,913,597 | A * | 6/1999 | Lin | H01R 13/514 362/227 |
| 6,155,849 | A * | 12/2000 | Kodama | H01R 13/62905 439/157 |
| 6,179,650 | B1 * | 1/2001 | Chih-Kai | H01R 13/514 439/540.1 |
| 6,193,550 | B1 * | 2/2001 | Yamashita | H01R 13/514 439/594 |
| 6,514,099 | B2 * | 2/2003 | Endo | H01R 13/641 439/357 |
| 6,811,445 | B2 * | 11/2004 | Caveney | H01R 13/514 439/676 |
| 6,837,751 | B2 * | 1/2005 | Vanden Wymelenberg | H01R 43/28 439/347 |
| 6,857,893 | B1 | 2/2005 | Patterson | |
| 6,984,144 | B1 * | 1/2006 | Nelson | G03G 15/605 439/374 |
| 7,018,228 | B2 * | 3/2006 | Patterson | H01R 13/6272 439/350 |
| 7,056,134 | B2 * | 6/2006 | Martin | G01R 1/06711 324/72.5 |
| 7,344,380 | B2 * | 3/2008 | Neidlein | H01R 13/6205 439/374 |
| 7,445,485 | B1 * | 11/2008 | Wu | H01R 13/514 439/160 |
| 7,625,250 | B2 * | 12/2009 | Blackwell | H05K 7/1425 439/717 |
| 8,002,585 | B2 * | 8/2011 | Zhou | F21V 19/04 439/320 |
| 8,182,297 | B2 * | 5/2012 | Lin | H01R 13/514 439/357 |
| 8,444,432 | B2 * | 5/2013 | Byrne | H01R 13/514 439/540.1 |
| 8,469,733 | B2 * | 6/2013 | Lee | G02B 6/4201 439/347 |
| 8,636,544 | B1 * | 1/2014 | Briant | H01R 13/658 439/607.25 |
| 8,932,083 | B2 * | 1/2015 | Ho | H01R 12/613 439/660 |
| 9,431,746 | B2 * | 8/2016 | Wu | H01R 13/443 |
| 9,718,410 | B2 * | 8/2017 | Cropley | B60R 9/058 |
| 2002/0119693 | A1 * | 8/2002 | Chen | H01R 13/6272 439/358 |

* cited by examiner

ELECTRICAL DEVICE ASSEMBLY AND ELECTRICAL CONNECTOR THEREWITH

BACKGROUND OF THE INVENTION

1. Field of the Invention

The present invention relates to the electrical device assembly and the electrical connector therewith, and particularly to the sliding arrangement during mating.

2. Description of Related Arts

The traditional coupling between the male connector and the female connector includes different ways including magnetic coupling. Anyhow, such a magnetic coupling is not reliable and tends to be decoupled from each other, A new reliable coupling way is desired.

SUMMARY OF THE INVENTION

The new way is to provide the electrical device assembly and the associated connectors coupled with each other via a sliding mechanism.

An electrical device assembly includes a first connector assembly coupled with a second connector assembly via a sliding arrangement. The first connector assembly includes a first terminal module and a first coupling device. The first terminal module includes a first mating face and the first contacts exposed thereon. The first coupling device includes the sliding rail forming a sliding slot with an insertion opening including a sliding opening so as to expose the sliding slot to an exterior. Notably, an electrical device may be equipped with such first coupling device. On the other hand, a second connector assembly includes a second terminal module and a second coupling device. The second terminal module includes a second mating face with the second contacts exposed thereon for coupling to the first contacts. The second coupling device includes guiding rib moveable along the sliding slot so as to have the second mating face moveable along the sliding slot and a portion of the second coupling device movable along the sliding opening, thus assuring mating between the first contacts and the corresponding second contacts.

DETAILED DESCRIPTION OF THE PREFERRED EMBODIMENT

Figure 1:
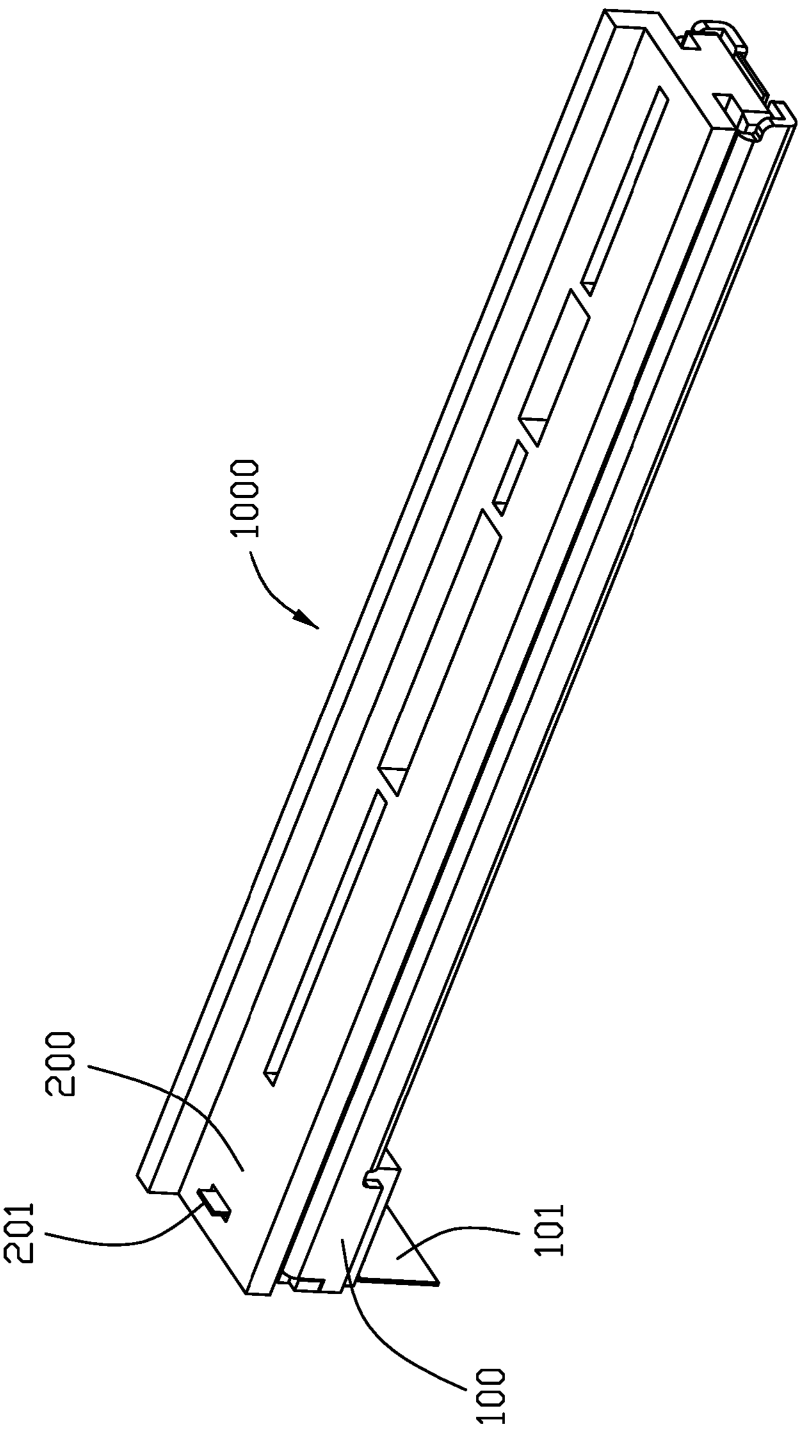
FIG. 1 is a perspective view of an electrical device assembly in accordance with the present invention.
Figure 2:
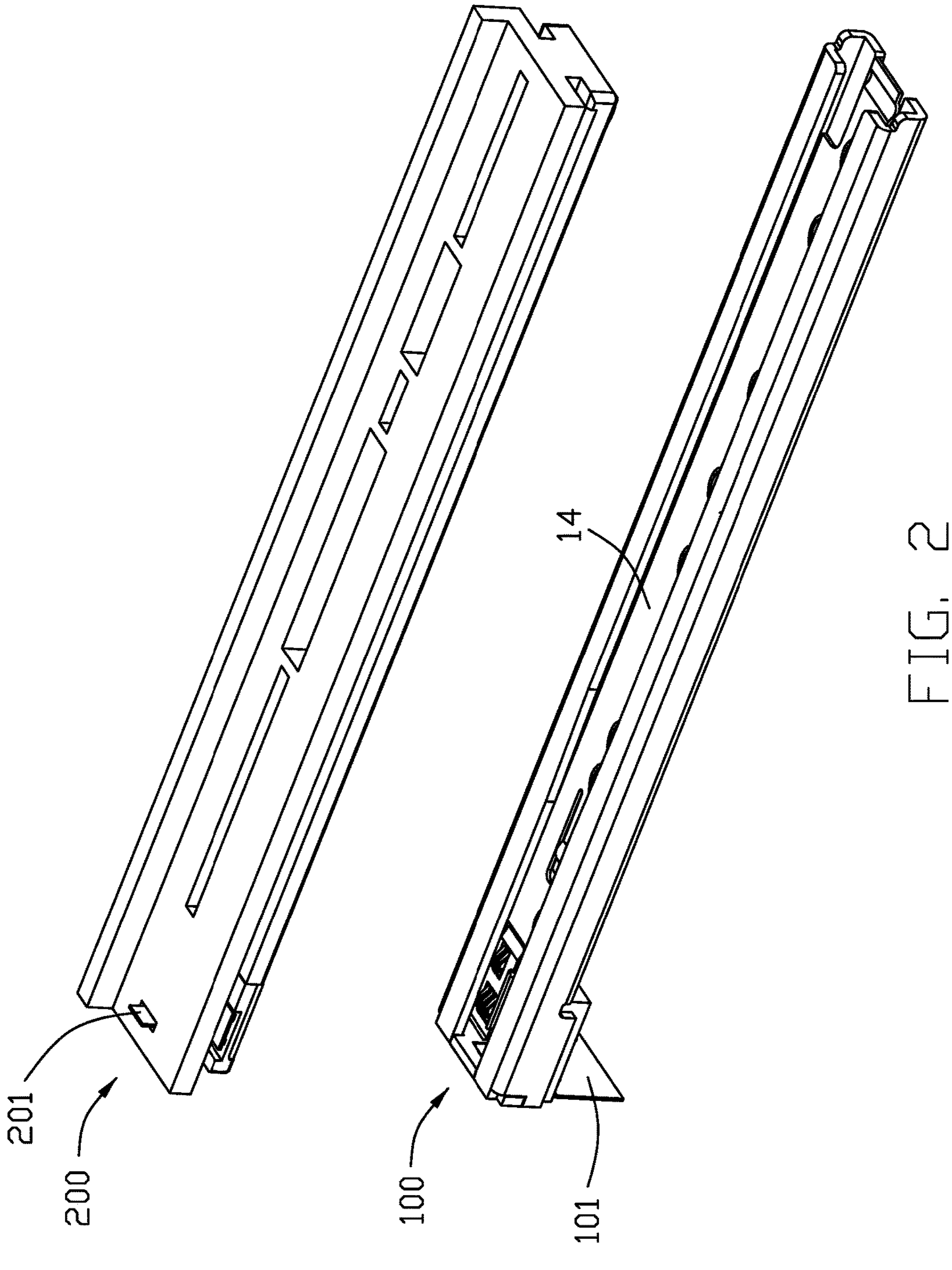
FIG. 2 is an exposed perspective view of the electrical device assembly of FIG. 1 wherein the first connector assembly is decoupling from the second connector assembly.
Figure 3:
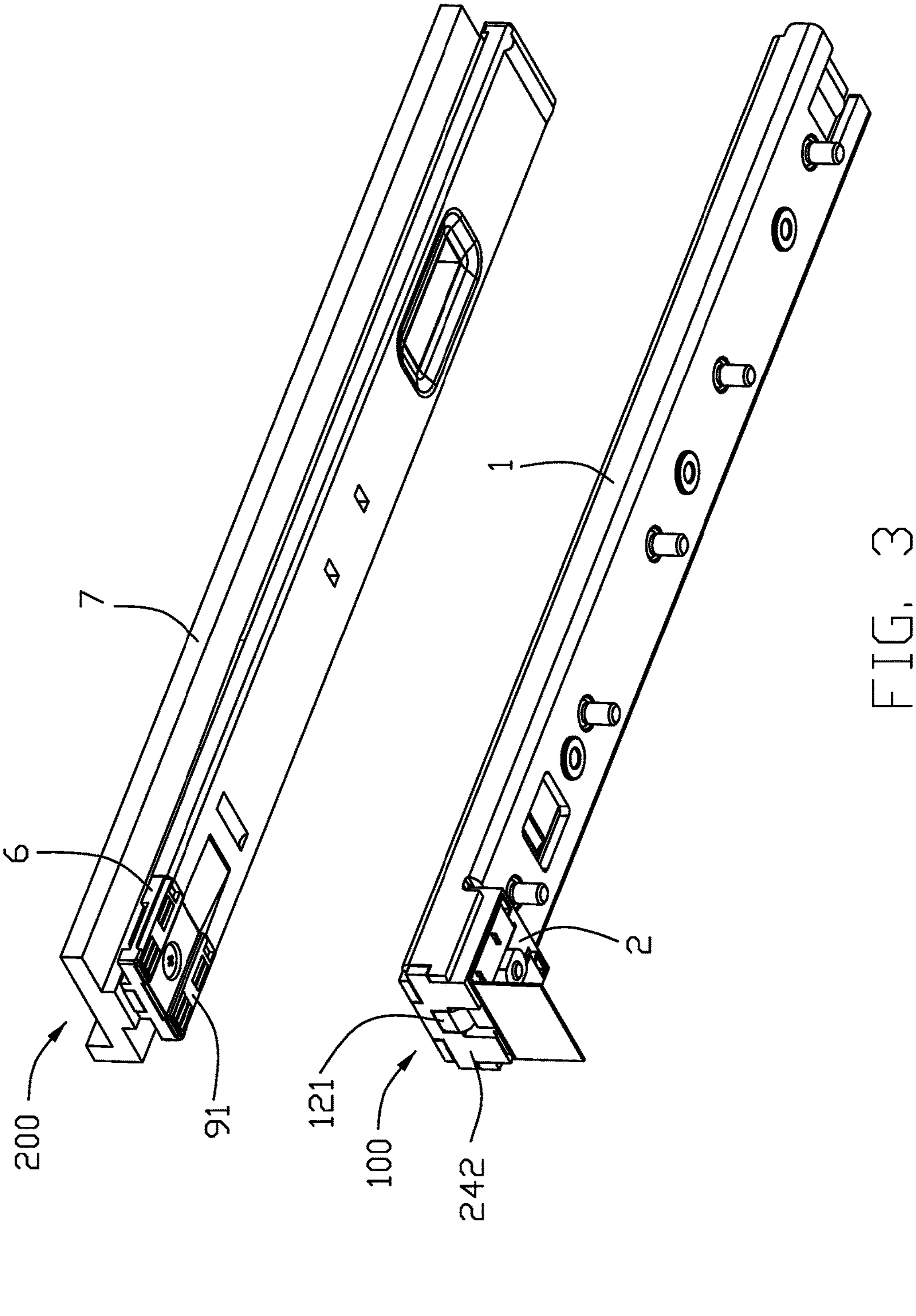
FIG. 3 is another exploded perspective view of the electrical device assembly of FIG. 1.
Figure 4:
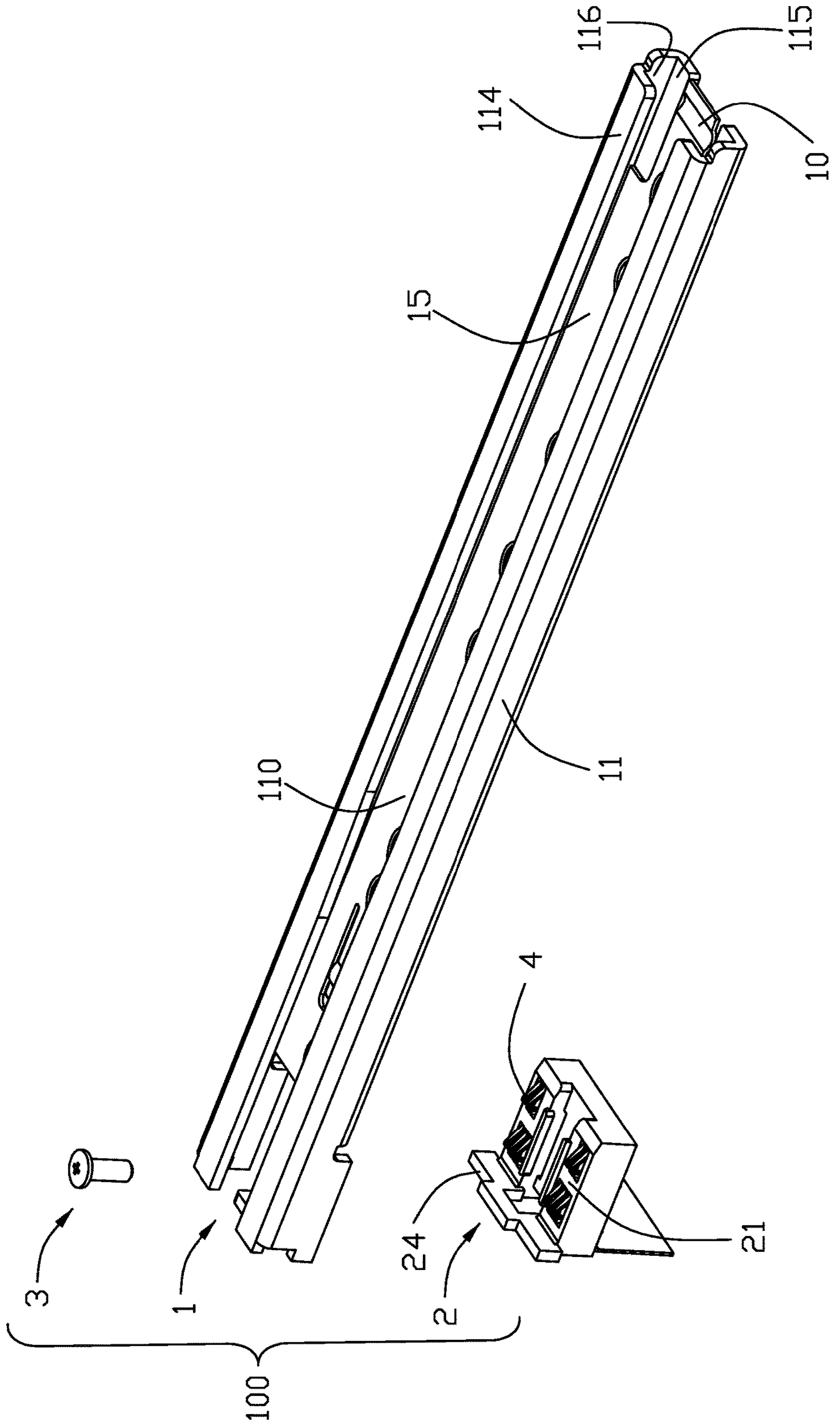
FIG. 4 is an exploded perspective view of the first electrical connector assembly of FIG. 1.
Figure 5:
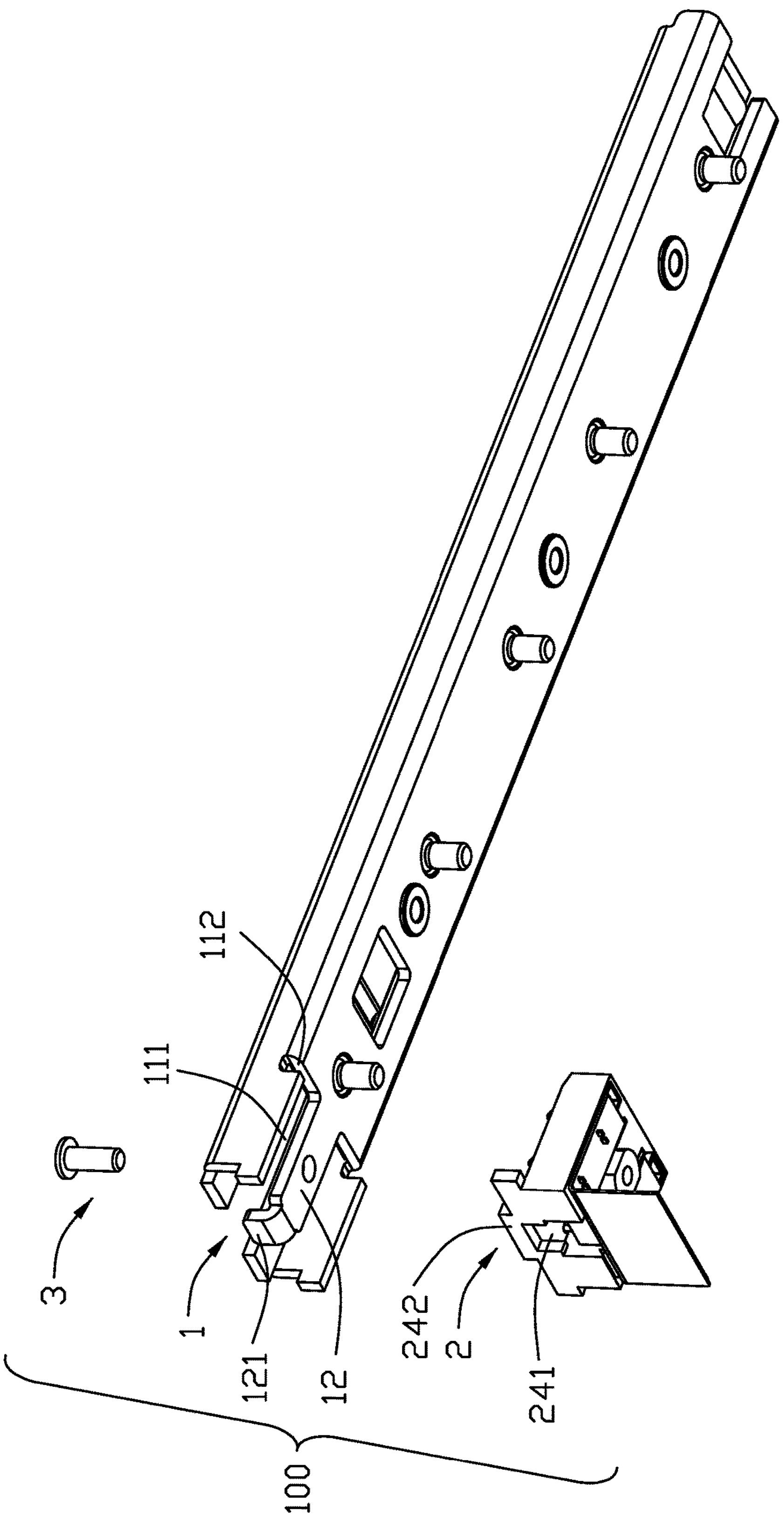
FIG. 5 is another exploded perspective view of the first electrical connector assembly of FIG. 1.
Figure 6:
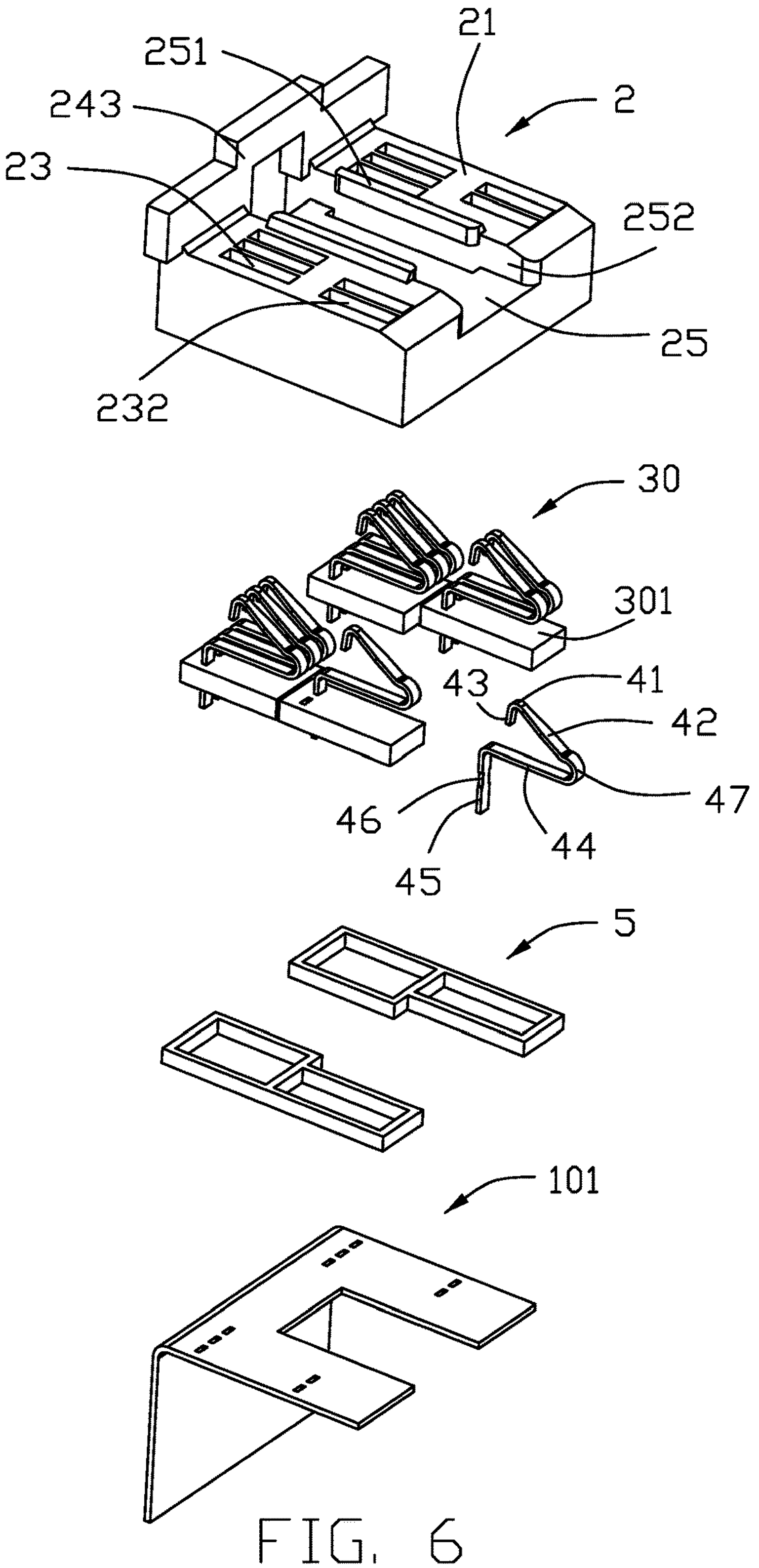
FIG. 6 is a further exploded perspective view of the first terminal module of the first electrical connector assembly of FIG. 4.
Figure 7:
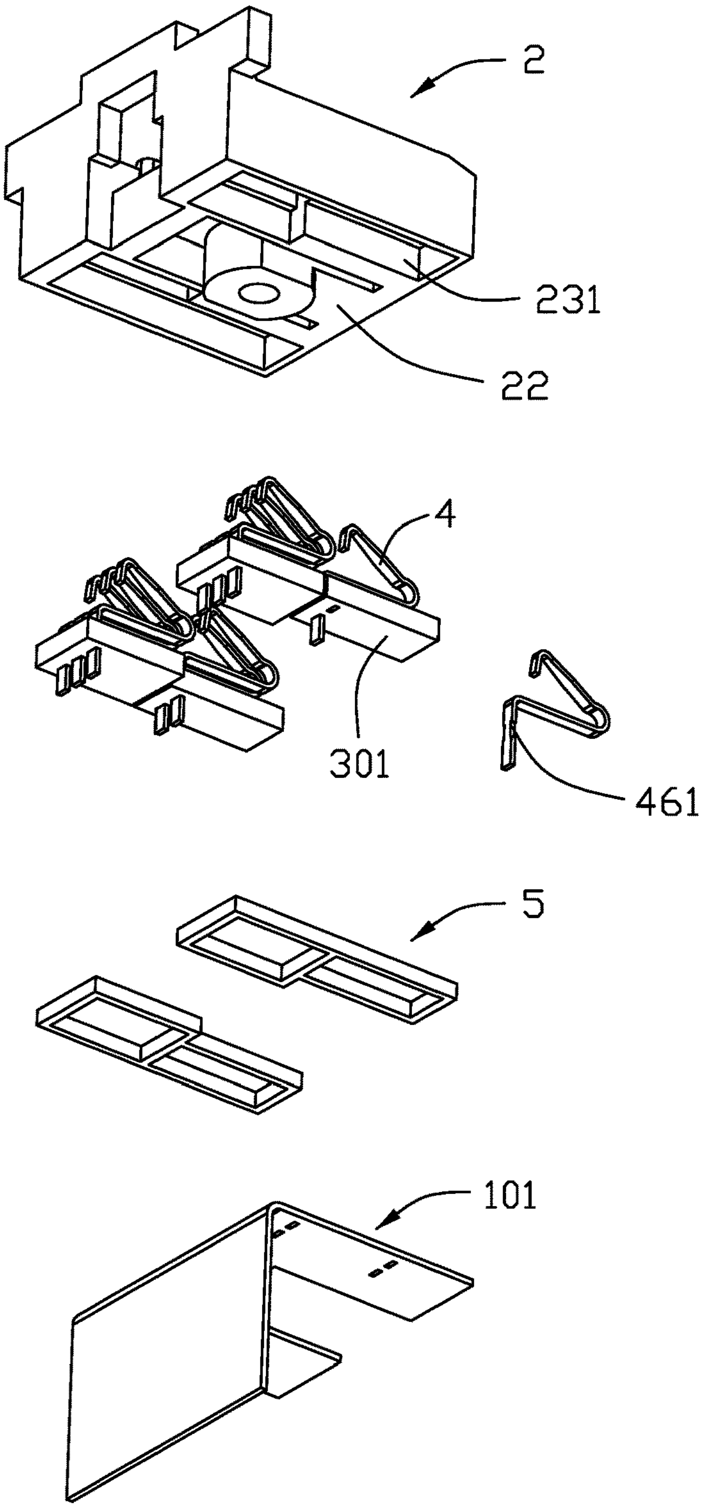
FIG. 7 is another exploded perspective view of the first terminal module of FIG. 6.
Figure 8:
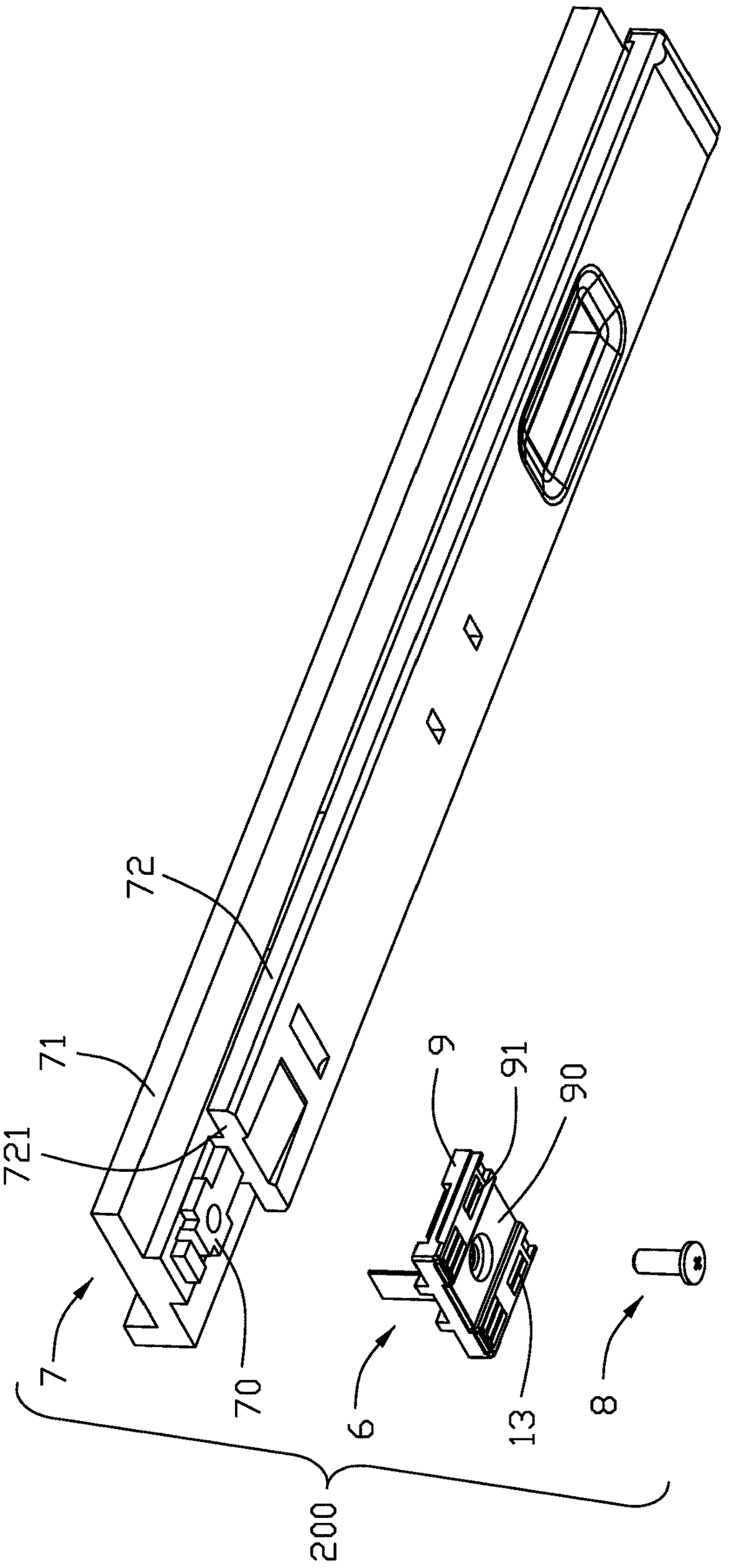
FIG. 8 is an exploded perspective view of the second terminal module of the second electrical connector assembly of FIG. 1.
Figure 9:
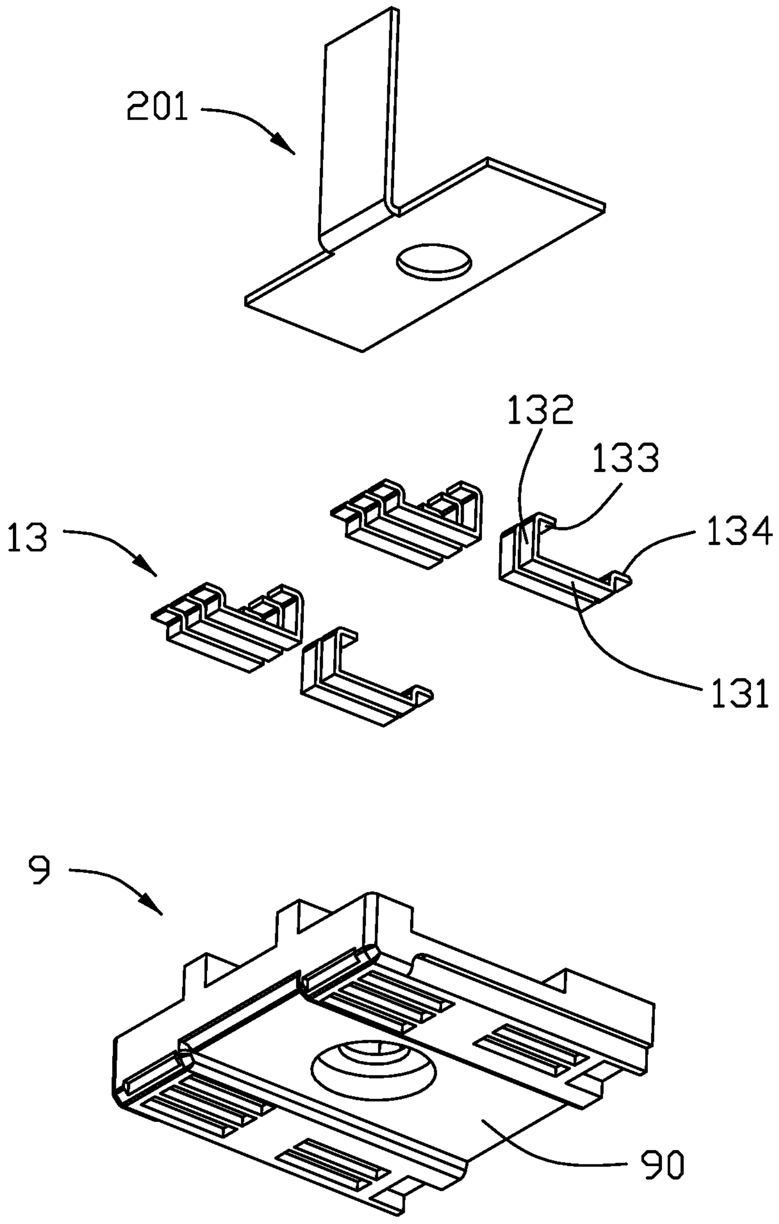
FIG. 9 is a further exploded perspective view of the second terminal module of FIG. 8.
Figure 10:
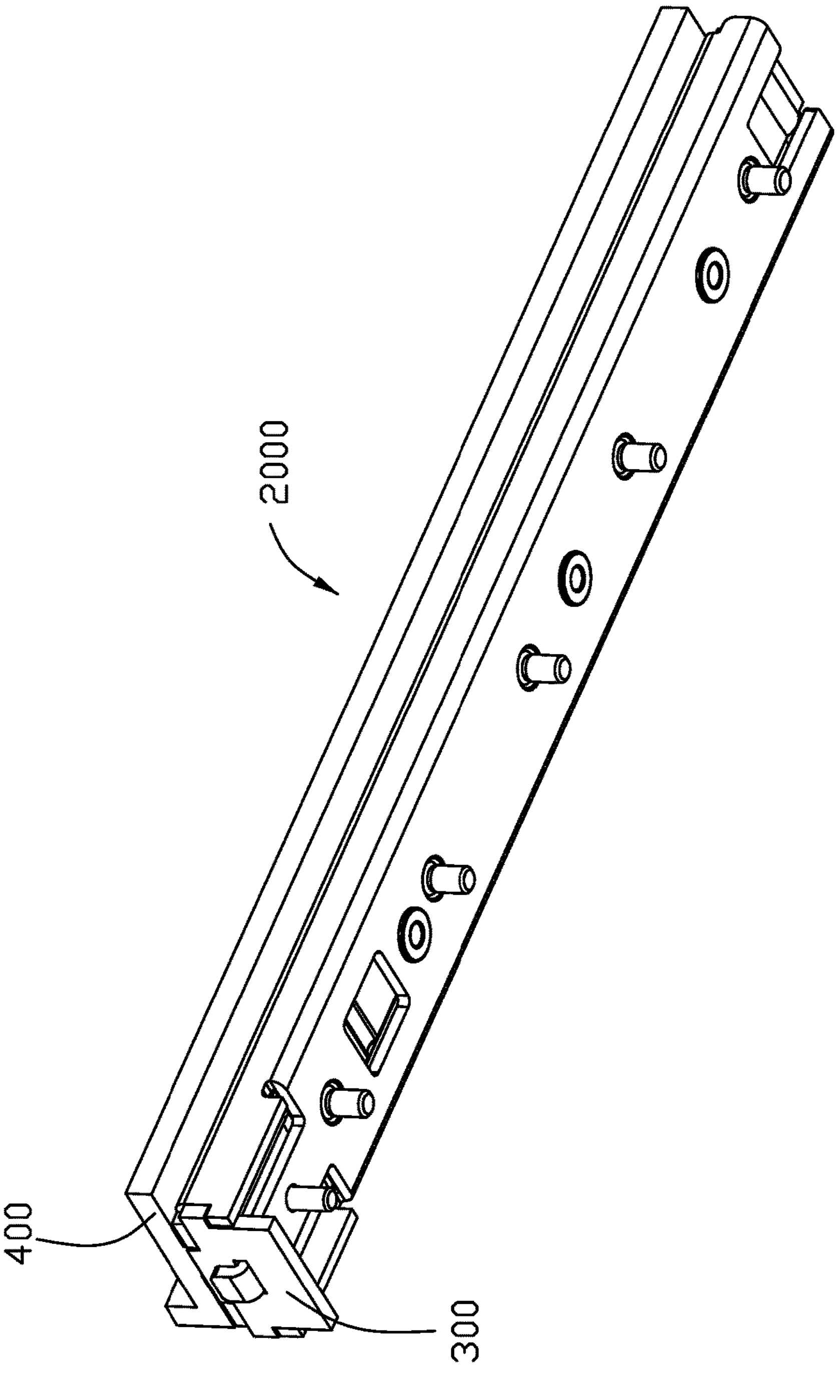
FIG. 10 is a perspective view of the electrical device assembly according to a second embodiment.

Referring to FIGS. 1-10, the electrical device assembly 1000 includes a first electrical connector assembly 100 linked to the first flexible printed circuit 101, and the second electrical connector assembly 200 linked to the second flexible printed circuit 201.

The first electrical connector assembly 100 includes a first terminal module 2, the first coupling device 1 and the first fastener 3 for combining the first terminal module 2 and the first coupling device 1 together for coupling with the second electrical connector assembly 200. The first terminal module 2 includes a first mating face 21 formed on the first insulator 2, and the terminal blocks 30 attached thereon. The first insulator 2 forms a first mating face 21 and the first mounting face 22. The terminal block 30 includes insulating body 301 and the first contacts 4 exposed upon the first mating face 21. In this embodiment, the first contacts 4 are insert-molded within the insulating body 301. The first insulator 2 forms four passageways 23 extending through the first mating face 21 and the first mounting face 22. The terminal blocks 30 are received within the passageways 23. The passageway 23 includes the assembling slot 231 extending through the first mounting face 22, and the receiving slot 232 extending from the assembling slot 231 to extend through the first mating face 21. The first receiving slot 232 is smaller than the assembling slot 231. The first insulating body 301 is received within the assembling slot 231 and the first contacts 4 extend through the receiving slots 232 to the first mating face 21.

The first contact 4 includes a first retaining section 46 retained in the insulating body 301, the first connecting section 45 extending from the first retaining section 46 and out of the insulating body 301, an extending section 44 extending from the other side of the first retaining section 46, and a spring tang 42 extending backward from the extension 44 via a bend 47. A deflection 43 is formed at the end of the spring tang 42, and the contacting point 41 is formed on the apex of the spring tang 42. The retaining section 46 forms barbs 461. The terminal block 30 are received within the passageway 23 and the sealer 5 may be formed between the insulating body 301 and the first insulator 2.

The first coupling device 1 includes a sliding rail 11 forming a sliding slot 14 with an insertion opening 10 at one end and a sliding opening 15 extending to the insertion opening to communicate the sliding slot 14 to an exterior in the vertical direction. The first terminal module 2 is secured to the first coupling device 1 along a front-to-back direction. The first terminal module 2 includes a insertion hole 241 extending along the front-to-back direction, and the first coupling device 1 includes the fixing arm 12 extending through the insertion hole 241. The first terminal module includes a rear face 242 and the fixing arm 12 includes a locking section upon the rear face 242. The first insulator 2 includes a clamping wall 243 perpendicular to the main body of the first insulator 2. The clamping wall 243 forms the insertion hole 241. The first insulator 2 includes an insertion groove 25 communicating with the insertion hole 241. The insertion groove 25 forms opposite inner walls 251 with securing blocks 252 so as to retain the fixing arm 12 therein. During assembling, the fixing arm 12 moves along the insertion groove 25 and the insertion hole 241 to the rear face 242 and eventually have the securing section 121 abut against the rear face 242.

The sliding rail 11 includes an inner bottom face 110 and two U-shaped sliding structure on two sides. The U-shaped sliding structure includes a bottom 115 coplanar with the bottom face 110, the top 114 opposite to the bottom 115 and the lateral side 116. The bottom face 110 forms a cutout 111 around the insertion opening 10, and an abutment face 112. When assembled, the first terminal module 2 is assembled into the first coupling device 1, the securing section 121 and the abutment face 112 restrain the first insulator 2 in the front-to-back direction. The first mating face 121 faces toward the sliding opening 15 to expose the first contacts 41.

The second electrical connector assembly 200 includes a second terminal module 6, the second coupling device 7 and the second fastener 8 securing the second terminal module 6 upon the second coupling device 7. The second terminal module 6 includes the second mating face 91 and the second mounting face (not shown). The second terminal module 6 includes the second contacts 13 exposed upon the second mating face 91 for mating with the first contacts 4. The second terminal module 6 includes a second insulator 9 to retain the second contacts 13 via an insert-molding process. The second contact 13 includes a second retaining section 132, the second connecting section 133 extending from the second retaining section 132 and exposed upon the second mounting face, a second contacting section 131 extending from the second retaining section 132 and exposed upon the second mating face 91. A securing section 134 extending from the other side of the contacting section 131, is embedded within the second insulator 9. The second insulator 9 includes a mating groove 90. During mating, the inner walls 251 of the securing blocks 252 of the first insulator 2 correspond to the mating groove 90 so as to have the first contacts 4 mated with the second contacts 13.

The second coupling device 7 includes a main body 71 and sliding ribs 72, and a mounting section 70. The sliding ribs 72 includes an abutment face 721 facing the mounting section 70. The second terminal module 6 is mounted upon the mounting section 70 with the second insulator 9 abutting against the abutment face 721 wherein the second mating face 91 is coplanar with the bottom face of the sliding ribs 72.

When the second electrical connector assembly 200 is assembled to the first electrical connector assembly 100 in a sliding manner, the second mating face 91 moves along the inner bottom face 110 of the sliding slot 14 until being mated with the first mating face 21. The sliding ribs 71 moves along the U-shaped structure of the sliding rail 11, and a portion of the second coupling device 7 moves along the sliding opening 15. When fully mated, a portion of the second terminal module 6 is received within the sliding slot 14 and the sliding opening 15, and other portions thereof are exposed outside of the sliding rail 11. Notably, because of the sliding coupling, the mating is reliable. Understandably, the configuration of the first contacts and the second contacts can be interchangeable.

Figure 11:
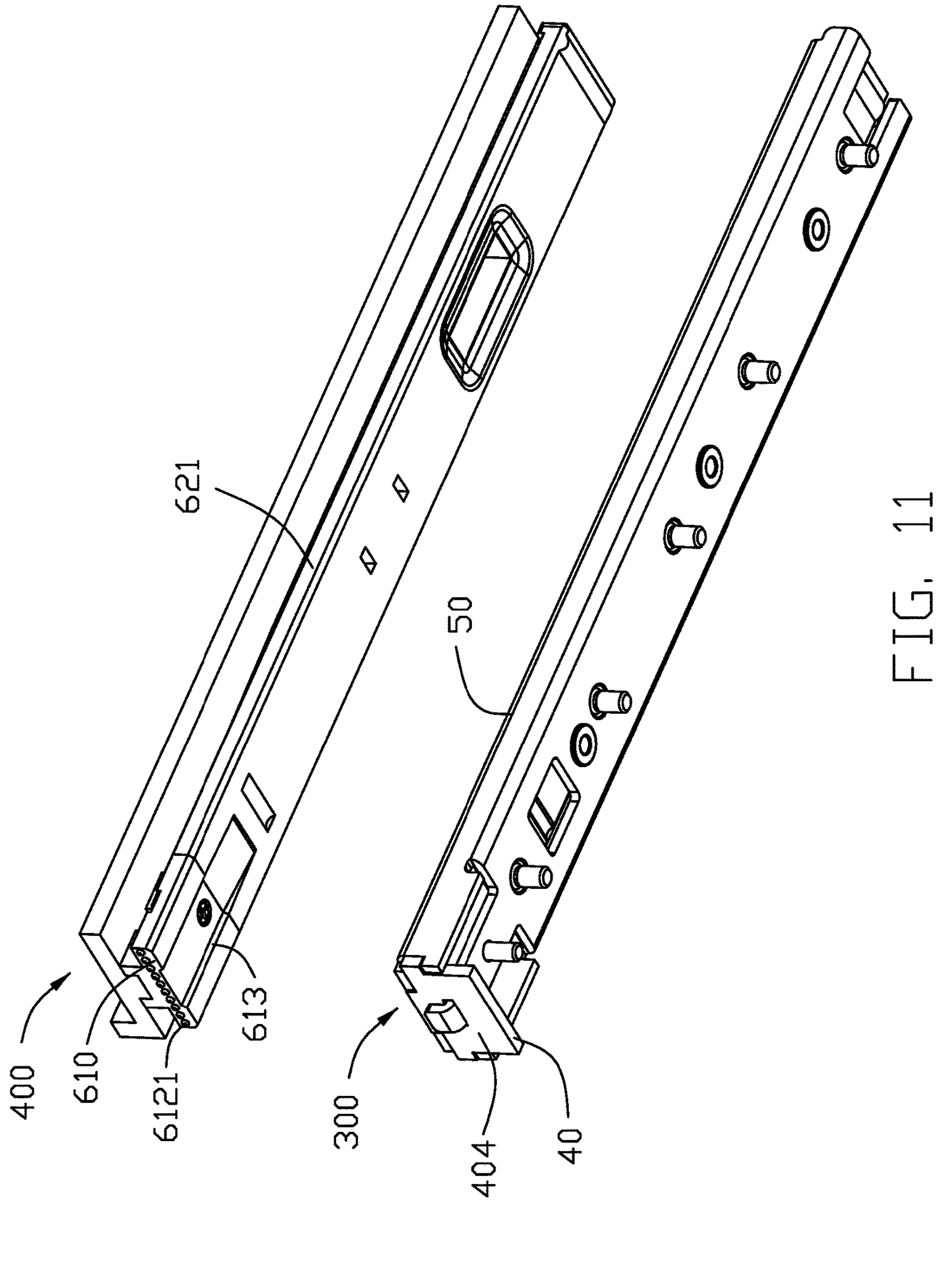
FIG. 11 is an exploded perspective of the electrical device assembly of FIG. 10.
Figure 12:
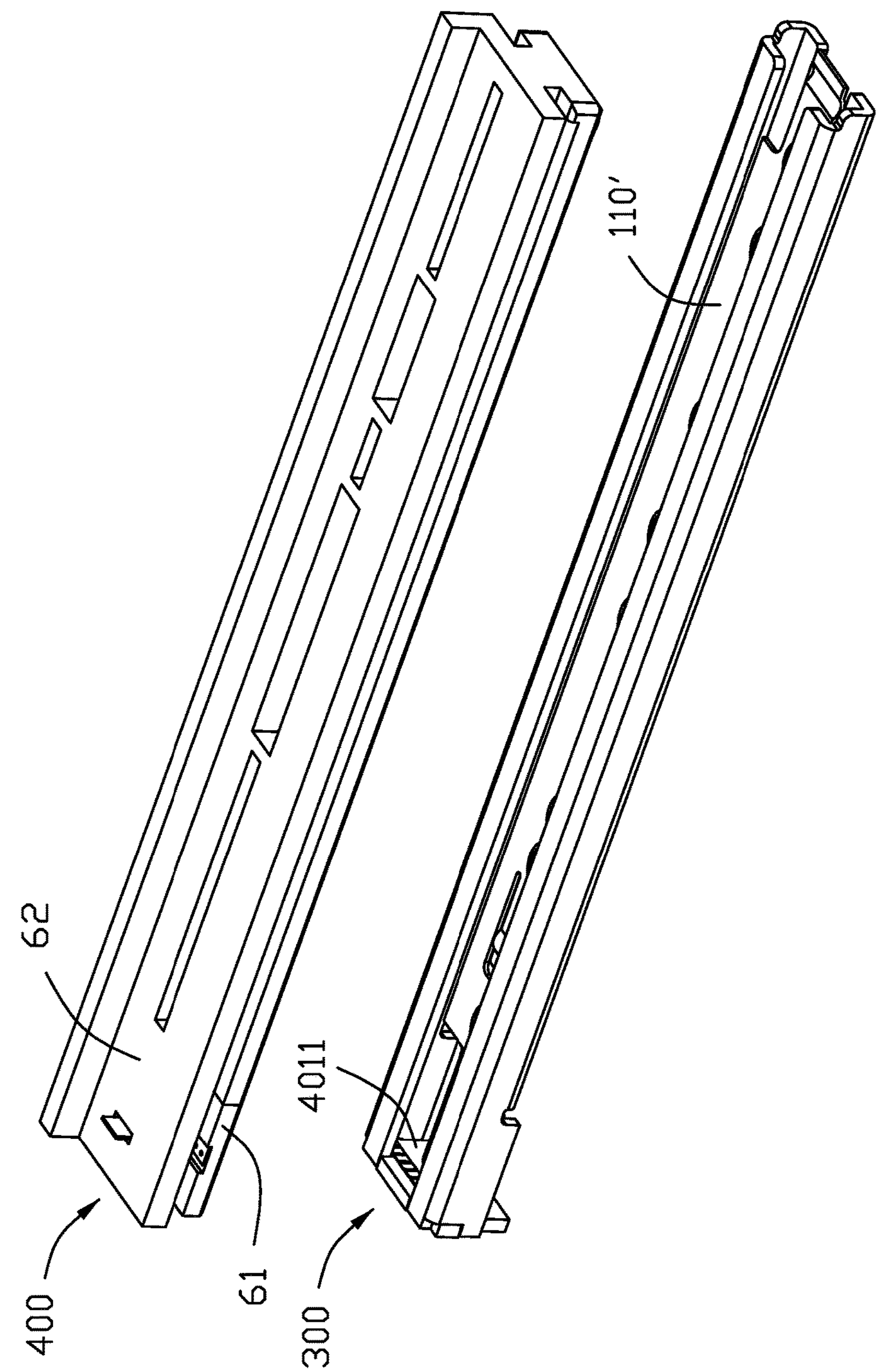
FIG. 12 is another perspective view of the electrical device assembly of FIG. 11.
Figure 13:
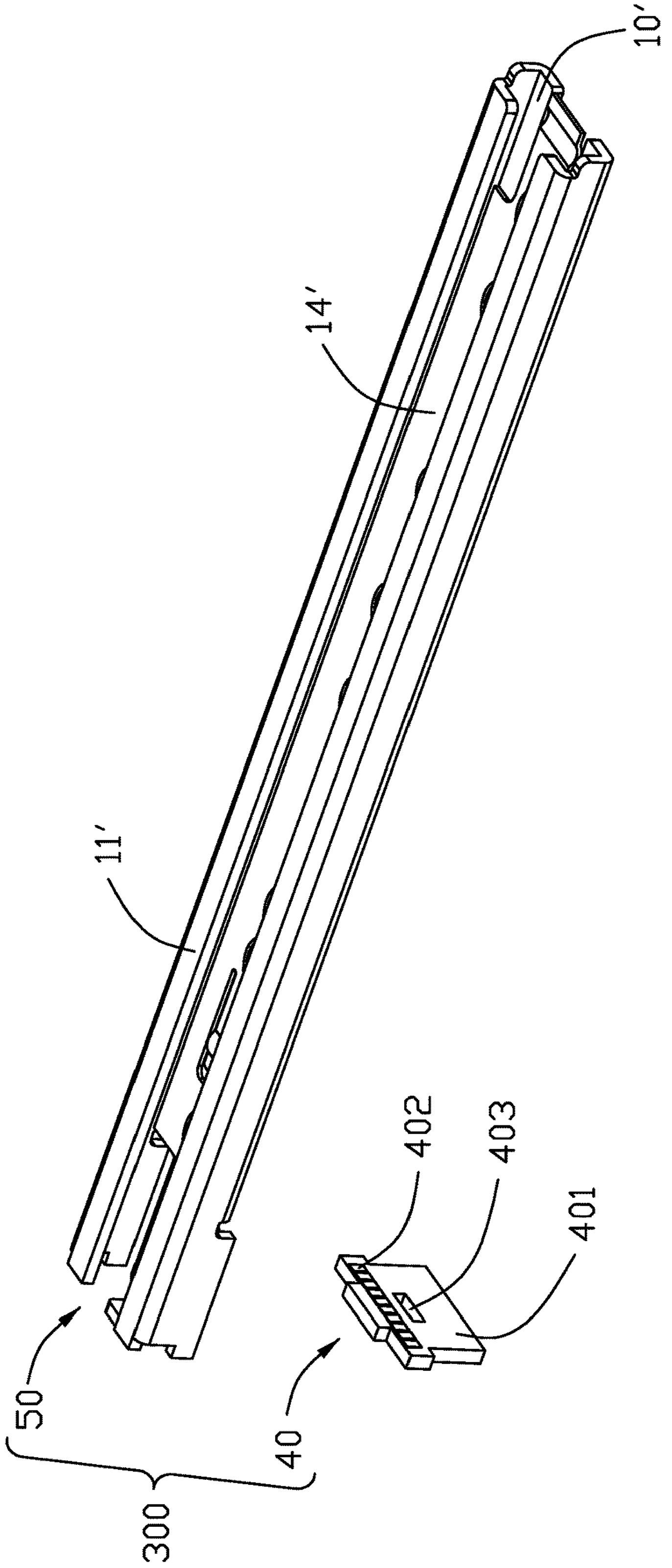
FIG. 13 is an exploded perspective view of the first electrical connector assembly of FIG. 10.
Figure 14:
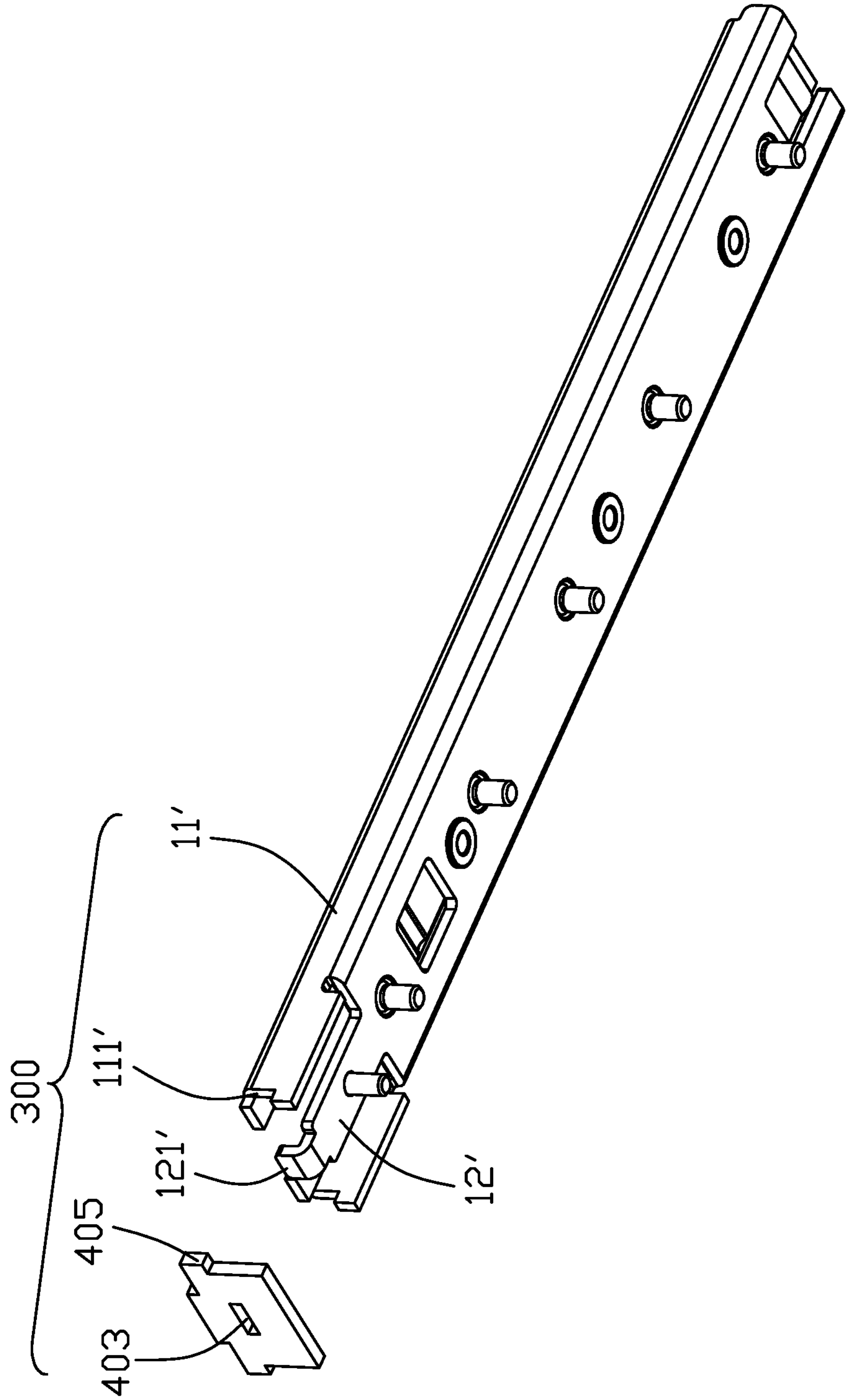
FIG. 14 is another exploded perspective view of the first electrical connector assembly of FIG. 13.
Figure 15:
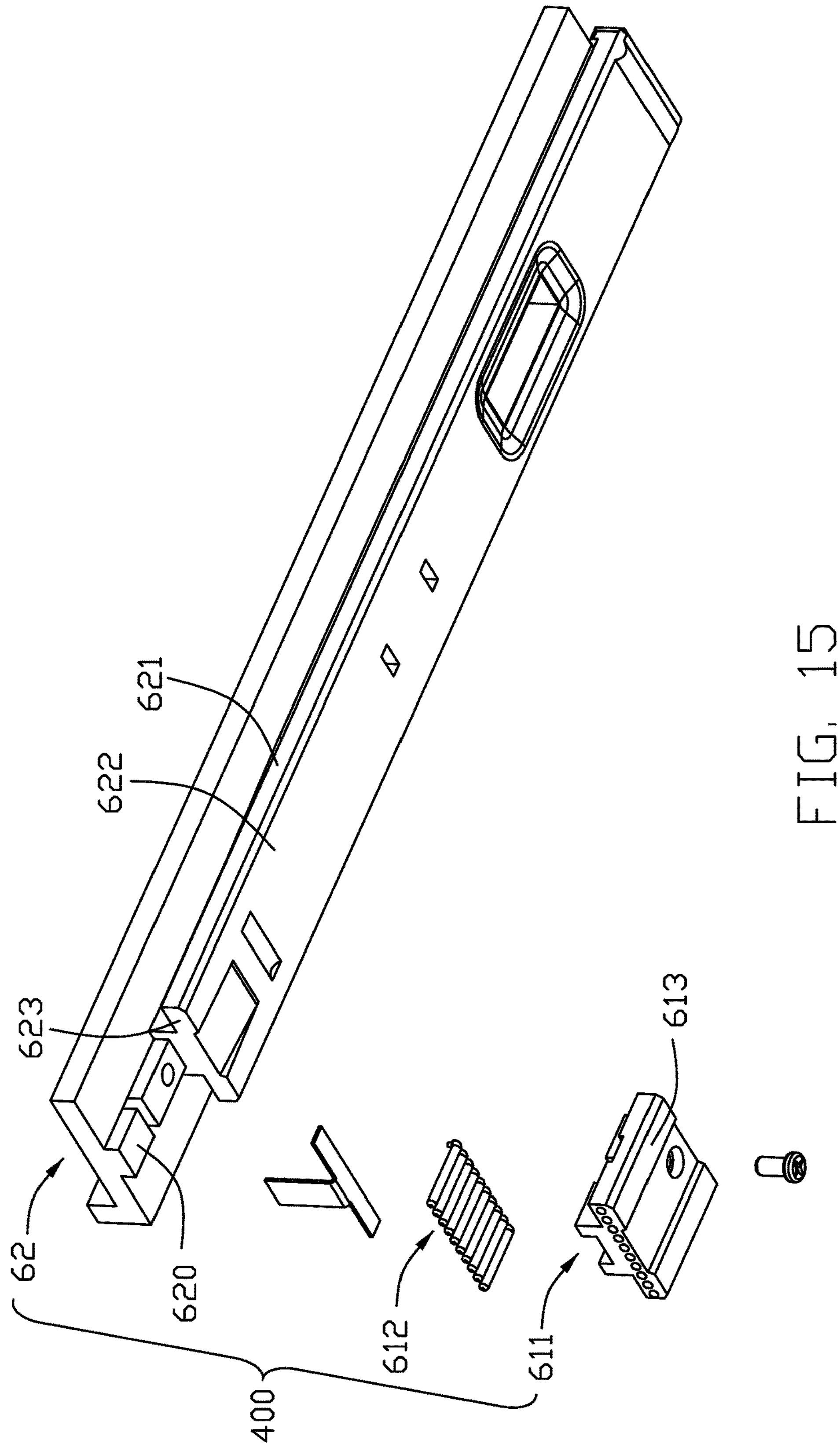
FIG. 15 is an exploded perspective view of the second electrical connector assembly of FIG. 10.

Referring to FIGS. 11-15, in the second embodiment the electrical device assembly 200 includes a first electrical connector assembly 300 and the second electrical connector assembly 400 both of which are connected to the corresponding flexible printed circuits, respectively.

The first electrical connector assembly 300 includes a first terminal module 40 and the first coupling device 50 which is similar to that of the embodiment. The first terminal module 40 includes a first insulator 401 and the planar contacts 402. The first insulator 401 includes a first mating face 4011 and the contacts 402 are exposed thereon. The first insulator 401 further includes a locking face 404 opposite to the first mating face 4011, and an insertion hole 403 extending through both the first mating face 4011 and the locking face 404. The fixing arm 12' extends through the insertion hole 403 to have the securing section 121' locked upon the locking face 404. The first insulator 401 forwardly abuts against the sliding rail 11'. The sliding rail 11' includes opposite U-shaped structures each with a cutout 111' around the fixing arm 12'. A securing block 405' is received within the corresponding cutout 111'.

The second electrical connector assembly 400 includes a second terminal module 61 and the second coupling device 62 similar to that of the first embodiment. The second terminal module 61 includes a second insulator 611 and the pogo pin contacts 612, i.e., being compressible in the mating/longitudinal direction. The second insulator 611 includes a second mating face 610 and the sliding face 613 coplanar with the bottom face 622 of the sliding ribs 621. The second mating face 610 is perpendicular to the sliding face 613. The moveable contacting ends 6121 of the compressible second contacts 612 are moveable around the second mating face 610, and the first terminal module 61 is assembled upon the mounting face 620 and abuts against the abutting face 623.

When the first electrical connector assembly 300 and the second electrical connector assembly 400 is coupled with each other, the sliding face 613 moves along the bottom face 110' of the sliding slot 14' until the moveable contacting ends 6121 exposed upon the second mating face 610 and the planar contacts 402 are mated with each other.

Figure 16:
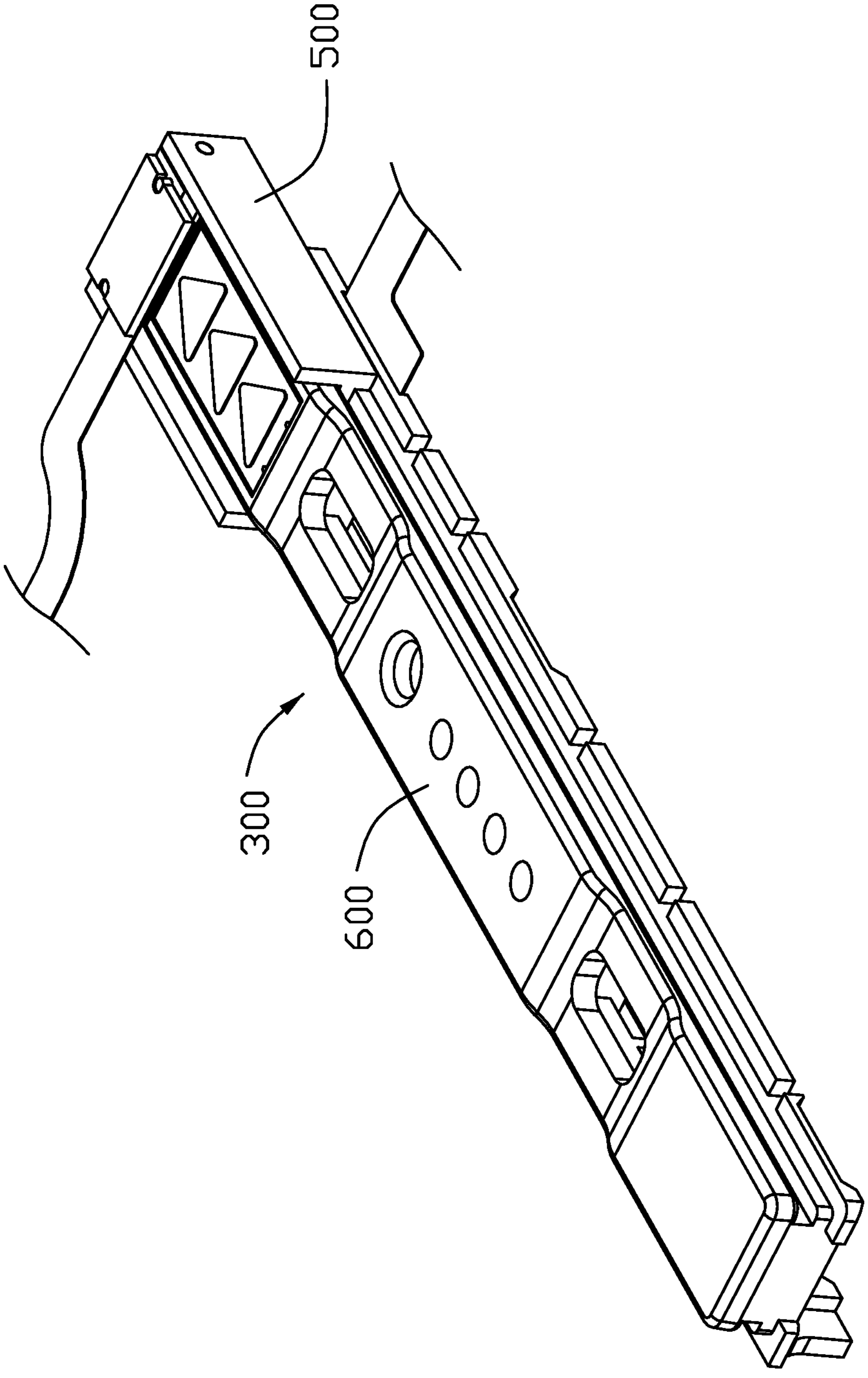
FIG. 16 is a perspective view of the electrical device assembly according to the third embodiment.
Figure 17:
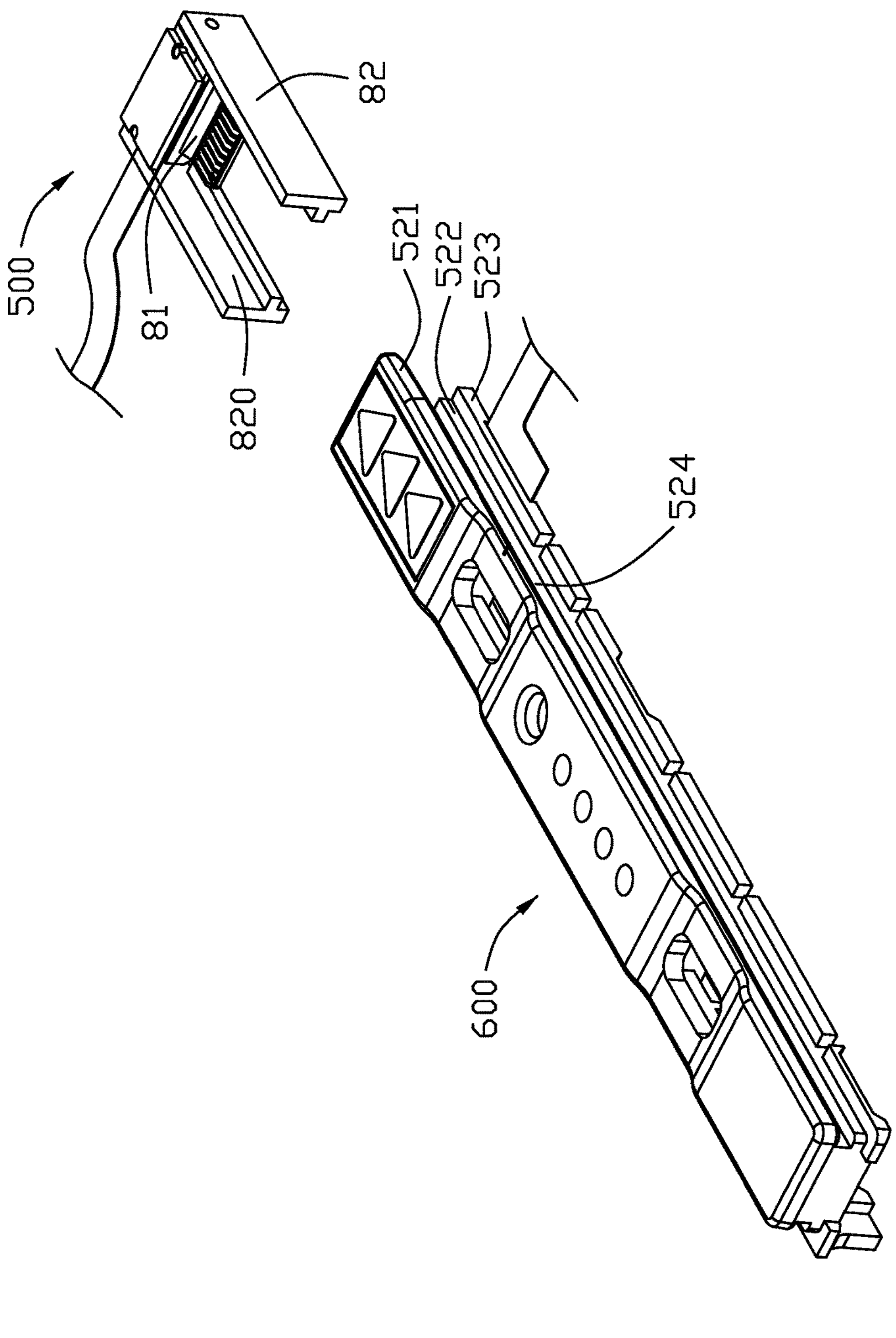
FIG. 17 is an exploded perspective of the electrical device assembly wherein the first electrical connector assembly is not electrically mated with the second electrical connector assembly.
Figure 18:
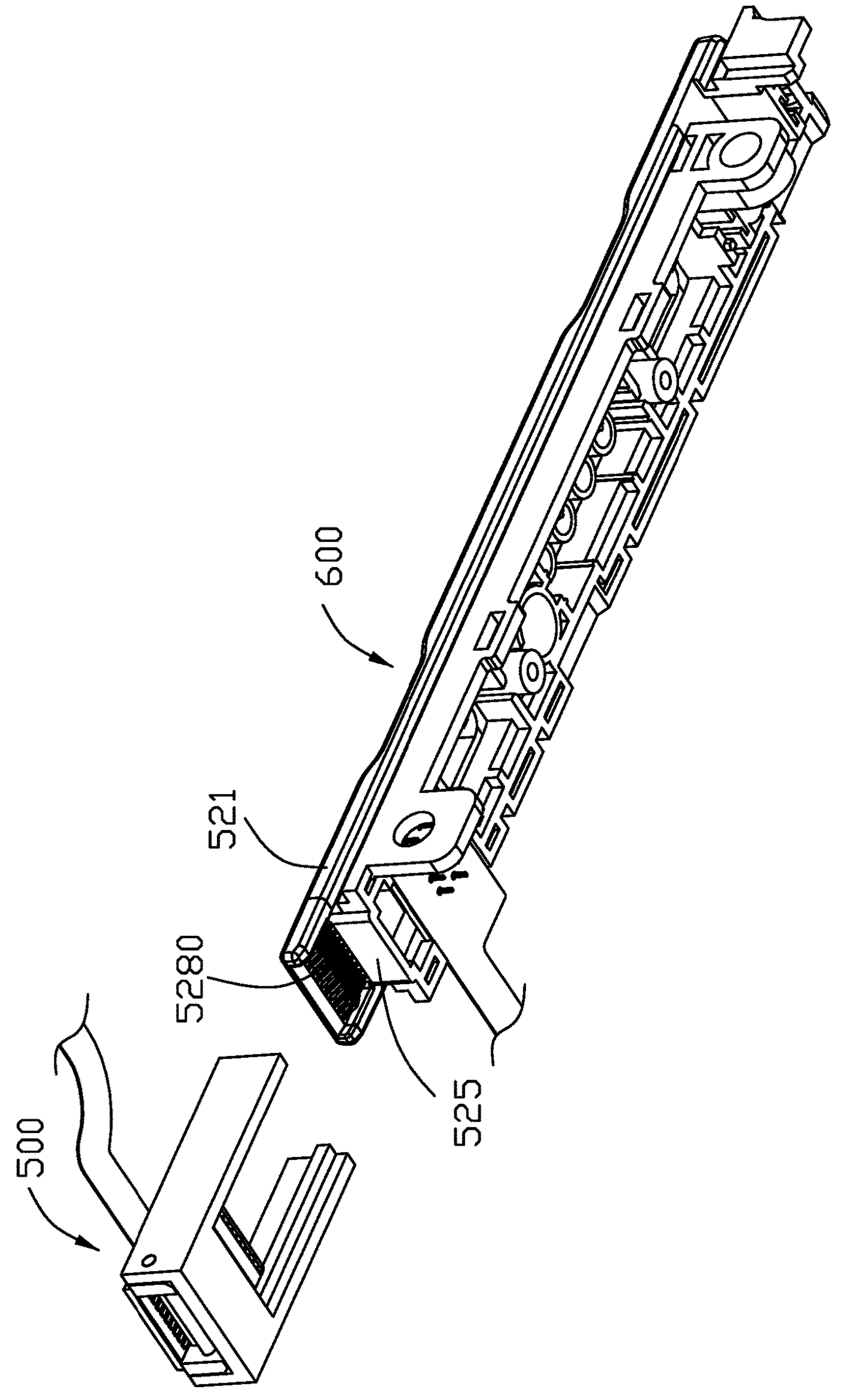
FIG. 18 is another exploded perspective view of the electrical device assembly of FIG. 17.
Figure 19:
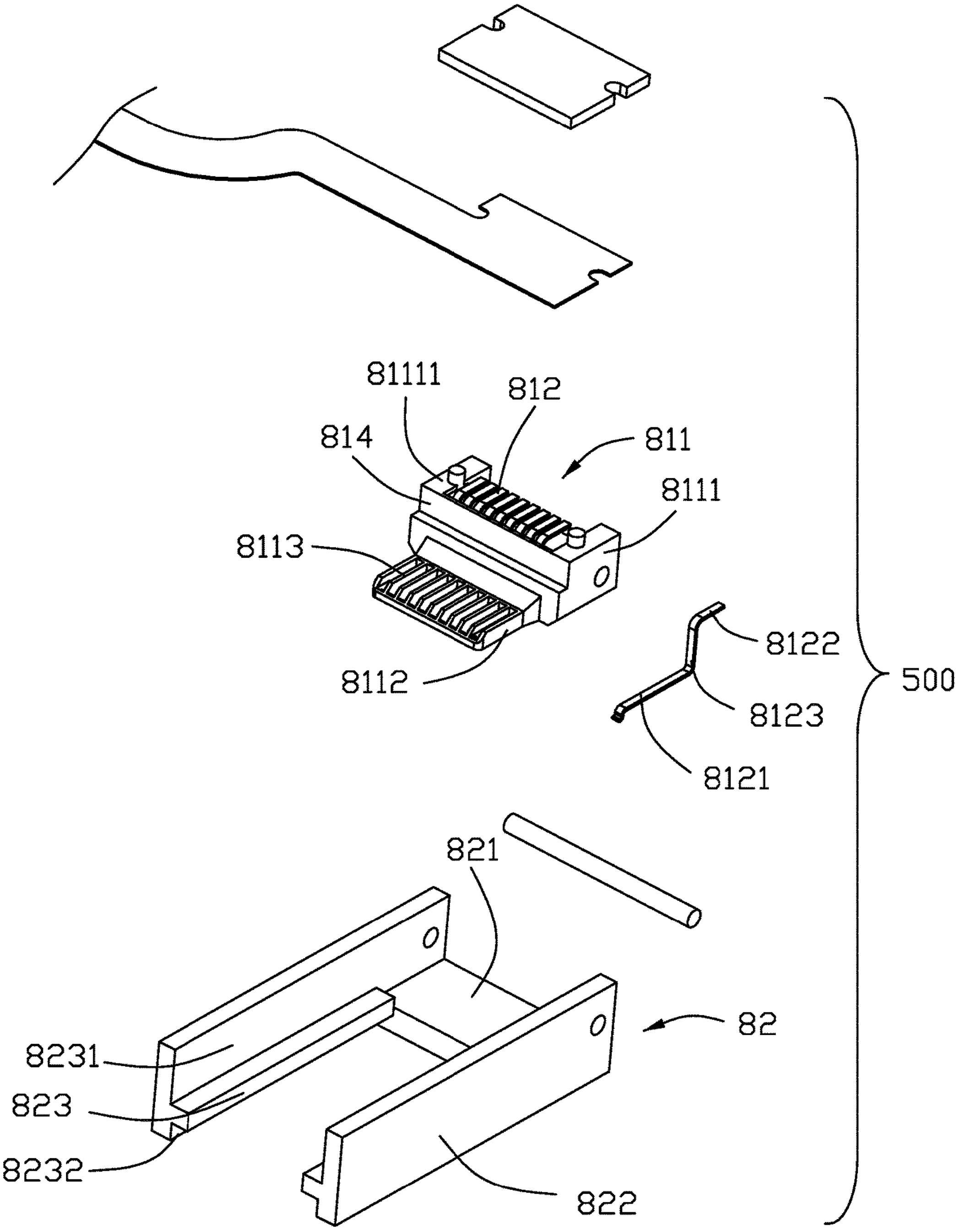
FIG. 19 is an exploded perspective view of the first electrical connector assembly of FIG. 16.
Figure 20:
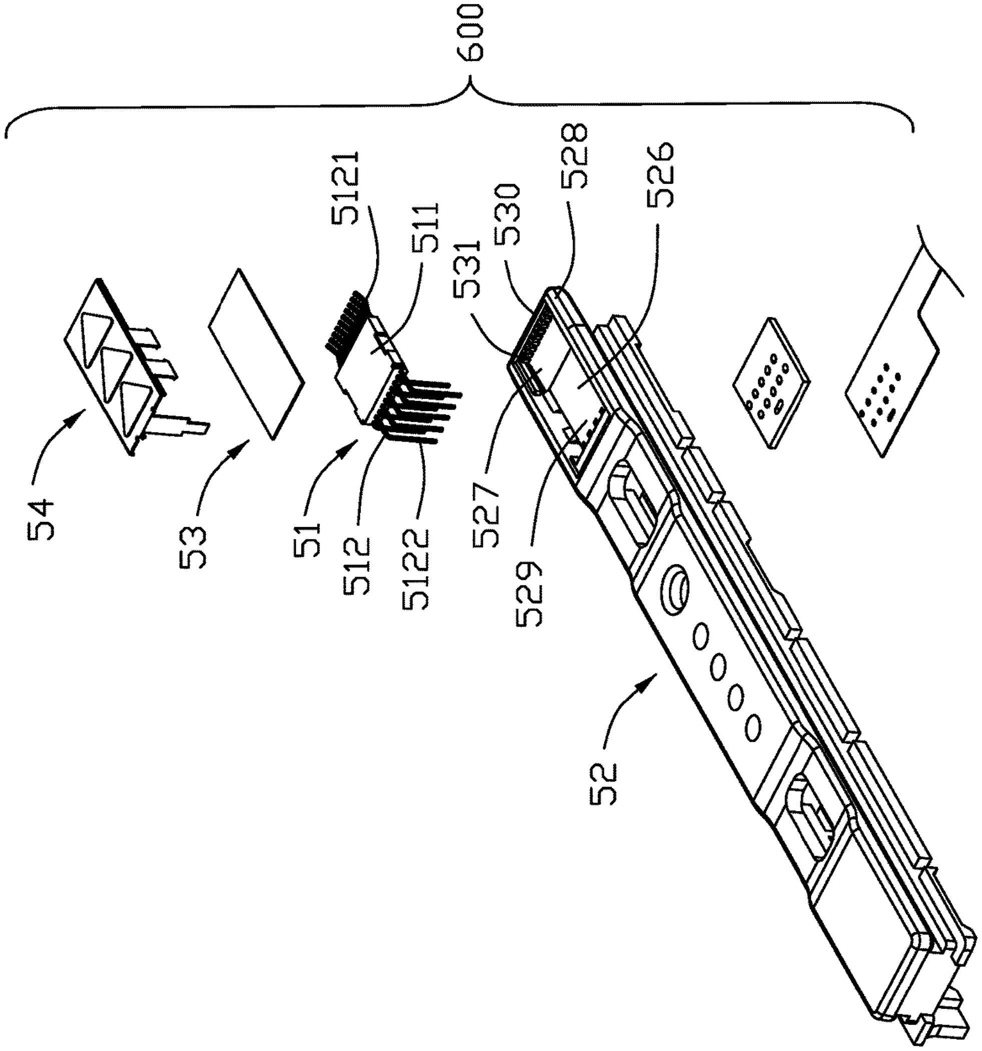
FIG. 20 is an exploded perspective view of the second electrical connector assembly of FIG. 16.

Referring to FIGS. 16-20, in the third embodiment the electrical device assembly 3000 includes a first electrical connector assembly 500 and the second electrical connector assembly 600 linked to the corresponding flexible printed circuits, respectively.

The first electrical connector assembly 500 includes a first terminal module 81 and a first coupling device 82 with the first terminal module 81 secured thereon. The first terminal module 81 includes a first insulator 811 and the first contacts 812 retained in the first insulator 811. The first insulator 811 includes a base 8111 and the mating portion 8112 extending forwardly from the base 8111, the mating portion 8112 is in a tongue form and defining a first mating face 8113. The first contact 812 includes a first planar contacting section 8121 exposed upon the first mating face 8113, a first connecting section 8122 extending beyond the first insulator 811, and a first retaining section 8123 between the first contacting section 8121 and the first connecting section 8122. The base 8111 includes an upper face 81111 located above the first mating face 8113 to form a step 814. The first connecting section 8112 is seated upon the upper face 81111 and parallel to the first contacting section 8121.

The first coupling device 82 includes a mounting face 821 with a pair of extending arms 822 by two sides to commonly form the assembling space (not labeled) to receive the first terminal module 81. The extending arms 822 forms a sliding rail with the corresponding sliding ribs 823 so as to cooperate with the extending arms 822 to commonly form a sliding slot (not labeled) with an insertion opening 820. The sliding slot forms a sliding opening to communicate the sliding slot to the exterior in the vertical direction. The mating portion 8112 extends forwardly and between the sliding ribs 823 and the base 8111 abuts a against the sliding ribs 823. The first mating face 8113 faces to the sliding opening. In details, the sliding ribs 823 divide the corresponding space into the first receiving space 8231 and the second receiving space 8232, and the distance between the sliding ribs 823 is smaller than both two first receiving space 8231 and the second receiving space 8232.

The second electrical connector assembly 600 includes a second terminal module 51 and the second coupling device 52 securing the second terminal module 51 thereto. The second terminal module 51 includes a planar second insulator 511 and the second contacts 512 integrally formed with the second insulator 511 via an insert-molding process. The second insulator 511 includes two opposite front end face and rear end face. The second contact 512 includes the resilient contacting section 5121 extending forwardly toward the front end face, the connecting leg 5122 extending rearwardly beyond the rear end face, the resilient contacting section 5121 forms a V-configuration, and the connecting leg 5122 forms a right angle structure.

The second coupling device 52 forms the first rib 521 and second rib 522 on each side to commonly form a sliding groove 524 therebetween. One end of the first rib 521 is assembled with the second terminal module 51, and one end of the second rib 522 is assembled to the second terminal module 51 and inwardly recessed from the first rib 521. The second coupling device 52 forms an abutment face 525 around the recessed end, and the abutment face 525 projects beyond the second rib 522 while inwardly recessed from the first rib 521. The first rib 521 has an assembling groove 526 around the recessed end, and the assembling groove 526 extends downwardly through a portion of the first rib 521 so as to form a frame 528 in front of the abutment face 525. The assembling groove 526 forms a assembling face 529 behind the frame 528, and the second insulator 511 is positioned upon the assembling face 529. The second terminal module 51 forms a second mating face 5280 in the frame 528, the resilient contacting section 5121 is exposed in the space. In details, the front part 530 of the frame 528 a plurality of partitions 531 with corresponding slots therebetween to restrain the corresponding resilient contacting sections 5121 therein. The second electrical connector assembly 600 further includes a metallic cover 54 assembled into the assembling groove 526 with an insulative plate 53 between the second terminal module 51 and the metallic cover 54 for preventing shorting between the second contacts 512 and the metallic cover 54.

When the second electrical connector assembly 600 is assembled into the first electrical connector assembly 500, the first rib 521 moves along the first receiving space 8231, the second rib 522 moves along the second receiving space 8232, the sliding rib 823 moves along the sliding groove 524, the second mating face 5280 moves along the sliding slot until the resilient contacting section 5121 of the second contact 512 above the second mating face 5280 is mated with the contacting section 8121 of the first contact 812 upon the first mating face 8113. During mating, the resilient contacting section 5121 may move between the partitions 531. Eventually, the frame 528 of the second coupling device 521 abuts against the step 814 of the first terminal module 81, and the mating portion 8112 abuts against the abutment face 525 of the second insulator 52.

In the first electrical connector assembly, the first terminal module may not be directly attached to the first coupling device but indirectly through a common carrier, as well as in the second electrical connector assembly. Understandably, the first coupling device and the second coupling device may be made by either plastic or metal.

What is claimed is:

1. An electrical device assembly comprising:

a first electrical connector assembly adapted to be mated with a second electrical connector assembly along a front-to-back direction, said first electrical connector assembly including:

a first terminal module discrete from but secured to a first coupling device, the first coupling device including a sliding rail forming a sliding slot along said front-to-back direction, an insertion opening at one end of the sliding slot in the front-to-back direction, and a sliding opening extending along the front-to-back direction to reach the insertion opening and to communicate the sliding slot with an exterior in a vertical direction perpendicular to said front-to-back direction; wherein the second electrical connector assembly is adapted to be inserted into the sliding slot in a first direction along said front-to-back direction; wherein the first terminal module is located at the other end of the sliding slot opposite to said insertion opening in said front-to-back direction; wherein said first terminal module is configured to be assembled into the first coupling device in a second direction opposite to the first direction from said other end.

2. The electrical connector assembly as claimed in claim 1, wherein said first terminal module includes a plurality of first contacts having resilient contacting sections thereof.

3. The electrical connector assembly as claimed in claim 1, wherein said second electrical connector assembly includes a second terminal module secured in a second coupling device which is configured with a sliding rib snugly and compliantly moveable along and received in the sliding slot in the front-to-back direction.

4. The electrical connector assembly as claimed in claim 3, wherein the second terminal module is located around one end of the second coupling device and mated with the first terminal module when the first coupling device and the second coupling device are fully coupled with each other.

5. The electrical connector as claimed in claim 3, wherein a mating face of the first terminal module and that of the second terminal module direct to the vertical direction.

6. The electrical connector assembly as claimed in claim 3, wherein when the first coupling device and the second coupling device is fully coupled with each other, the second coupling device extends outside of the sliding slot of the first coupling device in said vertical direction.

7. The electrical connector assembly as claimed in claim 3, wherein said second terminal module is configured to be assembled to the second coupling device in the vertical direction.

8. The electrical connector assembly as claimed in claim 3, wherein a mating face of the first terminal and that of the second terminal direct to the front-to-back direction.

9. An electrical device assembly comprising:

a first electrical connector assembly including:

a first terminal module discrete from but secured to a first coupling device, the first coupling device including a sliding rail forming a sliding slot along said front-to-back direction, an insertion opening at one end of the sliding slot in the front-to-back direction, and a sliding opening extending along the front-to-back direction to reach the insertion opening and to communicate the sliding slot with an exterior in a vertical direction perpendicular to said front-to-back direction, said first terminal module forming a first mating face thereof; and a second electrical connector assembly including:

a second terminal module discrete from but secured to a second coupling device in the vertical direction; wherein during coupling, the second coupling device is assembled to the first coupling device through said insertion opening and moved along the front-to-back direction with a sliding rib thereof received in the sliding slot and a main body located outside of the sliding slot until fully coupled whereby the first terminal module and the second terminal module are fully mated with each other; wherein said second terminal module defines a second mating face which is coplanar with a bottom surface of the sliding rib.

10. The electrical device assembly as claimed in claim 9, wherein both said first mating face and said second mating face direct in the front-to-back direction.

11. The electrical device assembly as claimed in claim 9, wherein both said first terminal module and said second terminal module are located at corresponding ends of the first coupling device and second coupling device.

12. The electrical device assembly as claimed in claim 11, wherein the first terminal module is located at the end opposite to the insertion opening in the front-to-back direction.

13. The electrical connector assembly as claimed in claim 1, wherein said first coupling device includes a fixing arm, and said first terminal module includes an insertion groove in which said fixing arm is received.

14. The electrical connector assembly as claimed in claim 9, wherein said second terminal module is linked with a flexible printed circuit extending through the second coupling device in the vertical direction.

15. An electrical device assembly comprising:

a first electrical connector assembly including:

a first terminal module discrete from but secured to a first coupling device, the first coupling device including a sliding rail forming a sliding slot along said front-to-back direction, an insertion opening at one end of the sliding slot in the front-to-back direction, and a sliding opening extending along the front-to-back direction to reach the insertion opening and to communicate the sliding slot with an exterior in a vertical direction perpendicular to said front-to-back direction; and a second electrical connector assembly including:

a second terminal module discrete from but secured to a second coupling device; wherein during coupling, the second coupling device is assembled to the first coupling device through said insertion opening and moved along the front-to-back direction with a sliding rib thereof received in the sliding slot and a main body thereof located outside of the sliding slot until fully coupled whereby the first terminal module and the second terminal module are fully mated with each other; wherein both said first terminal module and said second terminal module are located at corresponding ends of the first coupling device and second coupling device.

16. The electrical device assembly as claimed in claim 15, wherein the first terminal module is located at the end opposite to the insertion opening in the front-to-back direction.

* * * * *